(12) United States Patent
Claydon et al.

(10) Patent No.: US 6,935,608 B2
(45) Date of Patent: Aug. 30, 2005

(54) METHOD FOR PROTECTING THE DIAPHRAGM AND EXTENDING THE LIFE OF SIC AND/OR SI MEMS MICROVALVES

(75) Inventors: Glenn S. Claydon, Wynantskill, NY (US); Ernest W. Balch, Ballaston Spa, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/876,072

(22) Filed: Jun. 24, 2004

(65) Prior Publication Data

US 2005/0098749 A1    May 12, 2005

Related U.S. Application Data

(62) Division of application No. 10/277,065, filed on Oct. 21, 2002, now Pat. No. 6,774,337.

(51) Int. Cl.[7] .............................................. F16K 31/00
(52) U.S. Cl. ..................................... 251/61.1; 251/367
(58) Field of Search ........................ 251/61, 61.1, 356, 251/366, 367

(56) References Cited

U.S. PATENT DOCUMENTS 5,660,370 A * 8/1997 Webster ................. 251/129.17
6,073,482 A * 6/2000 Moles ....................... 73/53.01
6,607,907 B2 * 8/2003 McNeely et al. ......... 435/285.6
6,715,733 B2 * 4/2004 Wang et al. ................ 251/331

* cited by examiner

Primary Examiner—J. Casimer Jacyna
(74) Attorney, Agent, or Firm—Scully, Scott, Murphy & Presser

(57) ABSTRACT

A microvalve and a method of forming a diaphragm stop for a microvalve. The microvalve includes a first layer and a diaphragm member to control the flow of fluid through the microvalve. The method comprises the step of forming a contoured shaped recess extending inward from a surface of the layer by using a laser to remove material in a series of areas, at successively greater depths extending inward from said surface. Preferably, the recess has a dome shape, and may be formed by a direct-write laser operated via a computer aided drawing program running on a computer. For example, CAD artwork files, comprising a set of concentric polygons approximating circles, may be generated to create the dome structure. The laser ablation depth can be controlled by modifying the offset step distance of the polygons and equating certain line widths to an equivalent laser tool definition. Preferably, the laser tool definition is combined with the CAD artwork, which defines a laser path such that the resulting geometry has no sharp edges that could cause the diaphragm of the valve to tear or rupture.

7 Claims, 4 Drawing Sheets

_US 6,935,608 B2_

METHOD FOR PROTECTING THE DIAPHRAGM AND EXTENDING THE LIFE OF SIC AND/OR SI MEMS MICROVALVES

CROSS REFERENCE TO RELATED APPLICATION

The present application is a divisional application of U.S. Ser. No. 10/277,065, filed Oct. 21, 2002 now U.S. Pat. No. 6,774,337.

BACKGROUND OF THE INVENTION

1. Field of the Invention

This invention generally relates to methods for fabricating microvalves. More specifically, the invention relates to procedures for forming a contoured valve stop in a microvalve.

2. Background Art

Microvalves may be used to control the flow of a gas in high temperature, high corrosive environments. In one such microvalve, a thin diaphragm, sandwiched between adjacent SiC or Si layers or wafers, is used to control the flow of gas through the valve. In use, the diaphragm abuts against a seat around an inlet of the valve to close that inlet; and when the pressure of gas in this inlet rises above a given value, the diaphragm flexes upwards, allowing gas flow through the inlet and through the valve.

A cavity or recess is provided inside the valve to allow this upward flexing movement of the diaphragm; and as the diaphragm flexes upward, the diaphragm comes into contact with surfaces of this cavity. This contact may cause significant localized forces or stresses on the diaphragm, or specific portions of the diaphragm.

Shaping this cavity or recess in any particular way is difficult because of the very small dimensions involved. For instance, this cavity may have a width or diameter of about one millimeter and a depth of about 0.025 millimeters. In the past, reactive ion etch (RIE) has been used to create very small, three-dimensional features in SiC and/or Si wafers. RIE etches can provide excellent trenches with steep smooth side walls, but RIE does not lend itself to creating contoured shapes. Since RIE uses a metal mask, it precludes using a gray scale mask. In addition, RIE is time consuming (etch rate of 0.001 mm/min). Inductively coupled plasma (ICP) etch techniques can also make clean well-defined trenches, but these techniques also are not conducive to making sloped and contoured surfaces. Lastly, the microvalve features are much too small for mechanical machining.

SUMMARY OF THE INVENTION

An object of this invention is to provide an improved microvalve.

Another object of the present invention is to extend the life of a microelectromechanical structure (MEMS) microvalve diaphragm.

A further object of the invention is to provide a dome-shaped contoured valve stop, in a microvalve, to reduce stress concentrations at the edge of a thin diaphragm of the valve.

Another object of the invention is to form a dome-shaped contoured diaphragm stop in a microvalve, by combining a laser tool definition with CAD artwork which defines a laser path such that the resulting geometry has no sharp edges that would cause the diaphragm to tear or rupture.

These and other objectives are attained with a microvalve and a method of forming a diaphragm stop for a microvalve. The microvalve includes a first layer and a diaphragm member to control the flow of fluid through the microvalve. The method comprises the step of forming a contoured shaped-recess-extending inward from a surface of the layer by using a laser to remove material in a series of areas, at successively greater depths extending inward from said surface. Preferably, the recess has a dome shape, and may be formed by a direct-write laser operated via a computer aided drawing program running on a computer.

For example, CAD artwork files, comprising a set of concentric polygons approximating circles, may be generated to create the dome structure. The laser ablation depth can be controlled by modifying the offset step distance of the polygons and equating certain line widths to an equivalent laser tool definition. Preferably, the laser tool definition is combined with the CAD artwork, which defines a laser path such that the resulting geometry has no sharp edges that could cause the diaphragm of the valve to tear or rupture.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
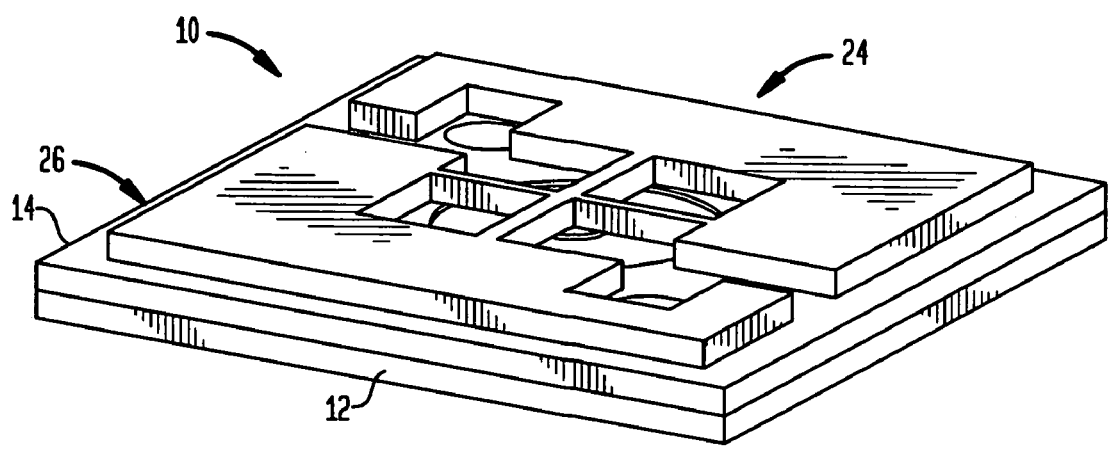
FIG. 1 is a perspective view of a microvalve embodying the present invention.
Figure 2:
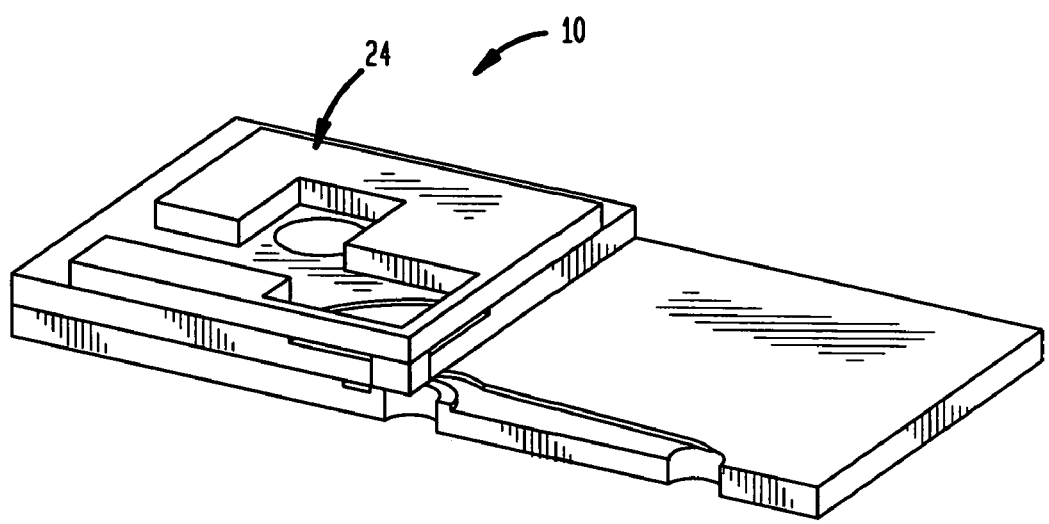
FIG. 2 is a partial cut away perspective view of the microvalve.
Figure 3:
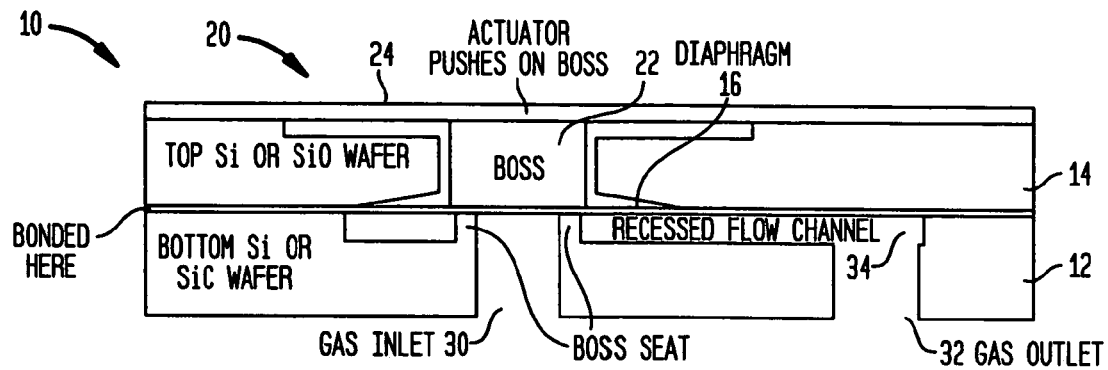
FIG. 3 is a cross-sectional view of the microvalve.
Figure 4:
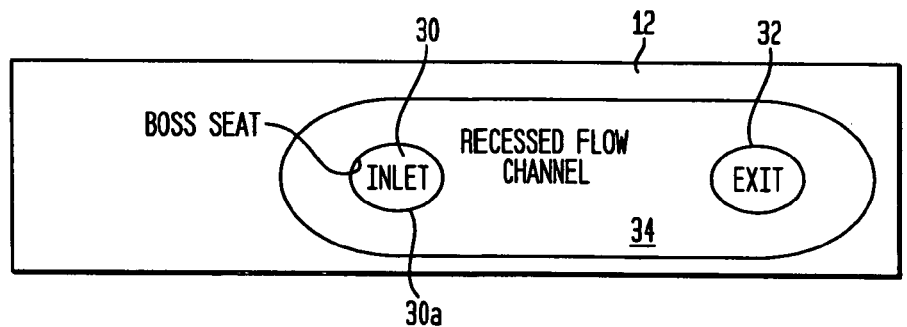
FIG. 4 is a top view of the bottom layer of the microvalve.

FIGS. 1–4 show a microvalve 10 generally comprising first and second layers 12 and 14, diaphragm member 16, and switching means 20. Switching means 20, in turn, includes boss 22 and actuation mechanism 24.

Generally, each of the layers 12 and 14 has a flat thin shape, and the layers are secured together to form a plate or valve body 26. This valve body forms an inlet opening 30 for receiving fluid, an outlet opening 32 for conducting fluid from the valve body, and a flow channel 34 for conducting fluid from the inlet to the outlet. The diaphragm 16 is disposed between the layers 12 and 14, and is moveable between open and closed positions. In the closed position, the diaphragm 16 blocks the flow of fluid from the inlet 30 to the flow channel 34; and in the open position, the diaphragm allows fluid flow from the inlet into that flow channel, allowing fluid flow from the inlet to the outlet 32 of the microvalve. The diaphragm 16 is biased to the closed position, and moves from the closed position to the open position when the pressure of fluid in the inlet 30 reaches a preset value. The switching means 20 is connected to the valve body 26 for moving the diaphragm 16 to the closed position against the pressure of fluid in the inlet 30.

In the preferred embodiment, the two layers 12 and 14 are each a material such as Silicon Carbide (SiC), Silicon (Si), or cermaic and are bonded together with a thin metallic diaphragm 16. The bottom layer 12 has through holes that form the valve inlet 30 and outlet 32, and layer 12 forms the flow channels 34 for the fluid. Also, preferably, as mentioned above, the switching means 20 includes a boss 22 and an actuation mechanism 24. The top layer 14 contains the boss 22, which is adjacent to the diaphragm 16, and the actuation mechanism 24 is used to push the boss, which in turn pushes the diaphragm against a seat 30a extending around the inlet 30 and thereby to close the valve 10.

With the embodiment of the microvalve 10 shown in FIGS. 1–4, the actuation mechanism 24 is a shape memory alloy, such as a titanium-nickel alloy. Other actuation mechanisms may be used such as piezoelectric ceramics, electromagnetics or microsolenoids.

In use, when a high gas pressure is supplied to the bottom feed through hole 30, the diaphragm 16 and boss 22 are pushed away from the seat 30a. If a sufficient enough high pressure is supplied, the diaphragm 16 is moved away from the seat 30a, allowing the gas to flow over and around this seat. The gas then flows through channels 34, which preferably are etched in the bottom SiC or Si layer 12, and exits through another through hole 32. The pressure at which gas will flow can be chosen by suitable choices of the material and thickness for diaphragm 16 as well as the actuation mechanism 24. For instance, with the embodiment of the microvalve 10 illustrated in the drawings, the pressure at which the gas will flow, referred to as the cracking pressure, is approximately 800 psi. Other pressures, or pressure ranges, may be used, however, and for example, the valve 10 can be modified to open at pressures from 800–1200 psi. These pressures, it may be noted, make the valve well suited for high pressure gas operation.

When the actuation mechanism 24 is activated, the boss 22 is pushed down, closing the diaphragm 16 against the boss seat 30a and stopping the flow of gas. With the embodiment of microvalve 10 shown in FIGS. 1–4, in which the actuation mechanism 24 is a shape memory alloy, the actuator is activated by conducting an electric current through the alloy, resistively heating the material and causing a change in the material modulus. The shape memory bars; which are in contact with the boss 22, effectively become stiffer, pushing the boss back down against the boss seat 30a. As mentioned above, other types of actuators, such as piezoelectric ceramics, microsolenoids, and electromagnets, may also be used in microvalve 10. Due to the design and construction, the actuation mechanism 24 is preferably located on the top surface of the top SiC or Si layer 14. This allows for easy implementation of a wide variety of actuation mechanisms 24. This location of the actuation mechanism 24 also helps to isolate that mechanism from the high temperature gas with which the valve 10 may be used.

Figure 5:
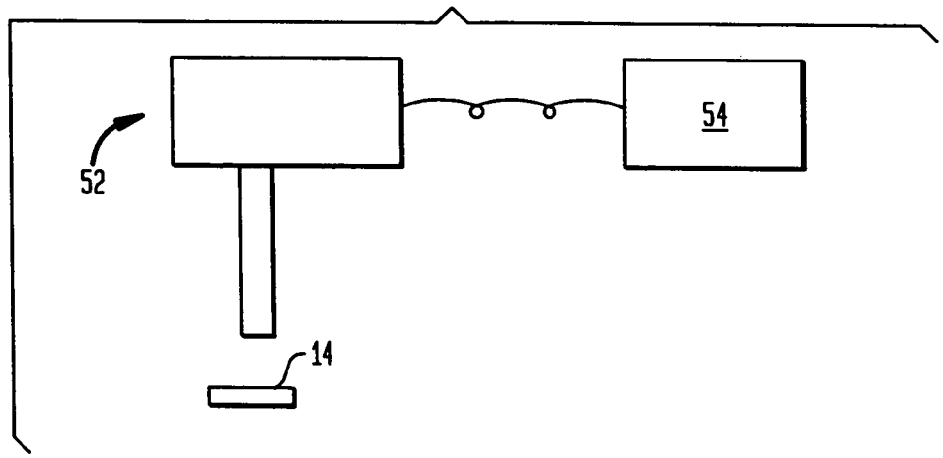
FIG. 5 illustrates a procedure for forming a valve stop in the microvalve.

A recess or cavity 50 in the valve body 26 is provided to allow the diaphragm 16, specifically the central portion thereof, to flex upward, away from valve seat 30a. With the preferred embodiment of microvalve 10, a sloped "dome" is ablated in the underside of the top SiC or Si wafer in order to provide a gentle valve stop. This extends valve life by reducing stress concentrations on the valve diaphragm 16. The smooth sloped edges of the recess provide a gentle stop and prevent rupturing the thin diaphragm of the valve. With reference to FIG. 5, a direct-write laser 52, controlled via a computer aided drawing program running on computer 54, may be used to form the desired three-dimensional contoured shapes in silicon carbide and silicon wafers. These materials absorb the laser energy sufficiently enough to be ablated in a relatively short period of time (it takes only a few minutes to pattern an entire wafer). Laser 52, for example, may be of the type that are currently designed for drilling holes through various dielectrics or conductors by ablating away material.

By adjusting several laser parameter settings, and applying the appropriate CAD input files, contoured shapes can be formed in the wafers. One suitable laser that may be used, for instance, is a tripled YAG laser having a nominal spot size of twenty-five microns, a Gaussian power distribution, and 355 nm wavelength. In this mode of operation the laser action is similar to a pen plotter and multiple tools can be defined for the laser in the same way that multiple tools are defined for photoplotters. The repetition rate controls the amount of power (energy per pulse) delivered by the laser. Furthermore, parameters such as settling time, drill style, defocus, etc., all combine to define a laser "tool." Multiple tools can be defined for the laser in the same way that multiple tools are defined for photoplotters. By experimenting with different wafer materials, laser tool definitions, and CAD representations, a wide range of suitable three-dimensional contours can be achieved. Other types of lasers, such as 248 nm Excimer, could also be used with the appropriate settings.

For example, CAD artwork files, comprising a set of concentric polygons approximating circles, may be generated to create the dome structure. The laser ablation depth can be controlled by modifying the offset step pitch of the polygons and equating certain line widths to an equivalent laser tool definition. Preferably, the laser tool definition is combined with the CAD artwork, which defines a laser path such that the resulting geometry has no sharp edges that could cause the diaphragm to tear or rupture.

Figure 6:
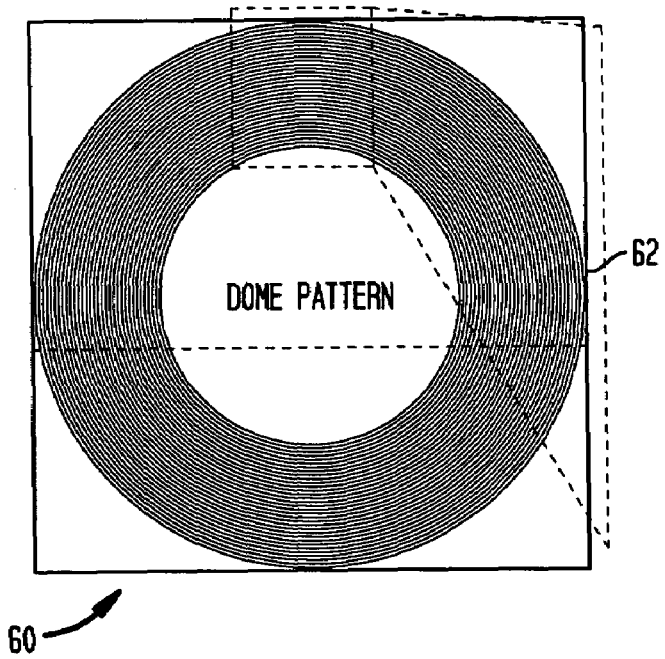
FIG. 6 shows the interior, dome pattern of the valve stop.
Figure 7:
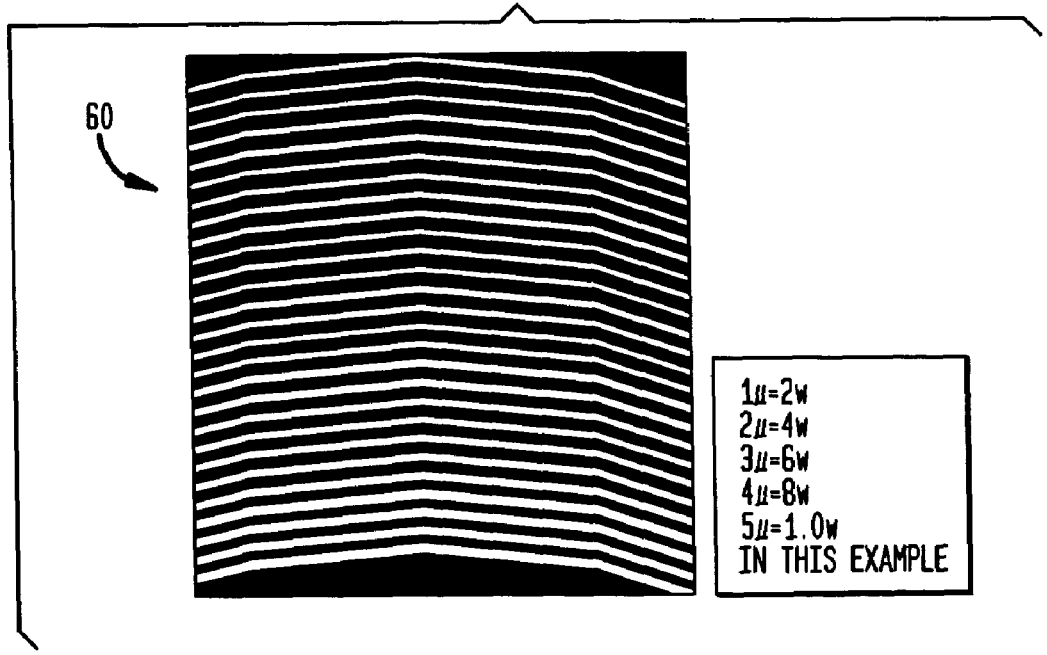
FIG. 7 is an enlarged view of a portion of FIG. 6.
Figure 8:
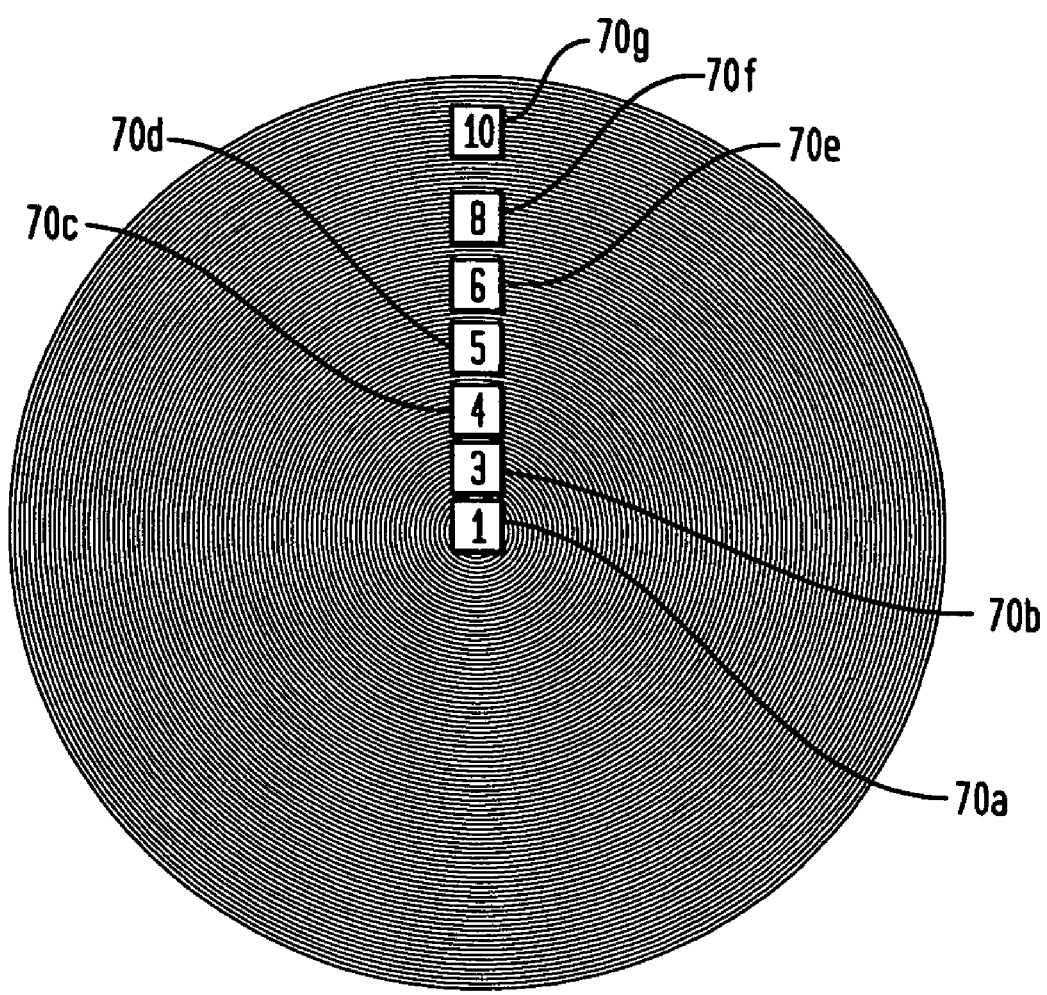
FIG. 8 illustrates an alternate dome pattern.

FIGS. 6–8 illustrate, as examples, specific patterns that may be used to form the dome-shaped recess. The pattern 60 shown in FIGS. 6 and 7 is comprised of a series of polygons 62. In this pattern, the spacing between lines is approximately constant, and the widths of the lines vary between 1 and 5 um. Other arrangements may be used, however, and for example, the pattern could be formed with approximately constant line widths, and the spacing between lines could vary. FIG. 8 illustrates an alternate pattern 70 comprised of one hundred thirty-two concentric, thirty-six sided polygons. These polygons are separated into seven radially adjacent groups 70a, 70b, 70c, 70d, 70e, 70f and 70g. The polygons in each group are equally spaced apart, and the spacing between adjacent polygons increases from group to group in the radially outward direction.

The above-described process for forming dome shaped recess 50 is easily controlled, repeatable, and much faster than etching approaches. The process is capable of creating features and shapes which cannot be created by standard reactive ion etching (RIE) processing. Also, the approach described above does not require creation of a hard photomask or gray scale mask.

Known MEMS fabrication processes may be used for the construction of the whole valve 10. This allows the possibility for low cost microvalves due to the economies of scale—many valves can be fabricated per substrate wafer. In addition, due to the inherent accuracy of these fabrication processes, such as lithography, microvalves can be produced with very precise features. In addition, preferably, the diaphragm material and thickness (choosing modulus and thickness to determine membrane "stiffness") and the actuation mechanism are chosen such that the microvalve can control very high pressure gas flows. The approximate pressure range of the current preferred embodiment is between 800–1200 psi.

As will be understood by those of ordinary skill in the art, the individual elements of microvalve 10 may have a wide range of specific dimensions. With one specific embodiment, for example, that has been actually reduced to practice, the shape memory alloy TiNi bars 24 are 0.010" square and 0.040" long, the diaphragm 16 is 0.0005" thick, and the boss 22 has a diameter of 0.020". Also, with this embodiment, the flow inlet 30 and the flow outlet 32 each have a diameter of 0.020", and the flow channel 34 is 0.002" deep. In addition, the dome shaped recess 50 has a diameter of 1.270 mm, the outer edge of the dome is flush with the wafer surface and the center of the dome is 0.025 mm high. This allows the valve diaphragm 16 to open and still provide a smooth surface to stop the back of the diaphragm and prevent rupturing up to at least 1200 psi pressure.

As will be understood, valve 10 may be changed in many ways without departing from the scope of the present invention. For example, with modifications within the ability of those of ordinary skill in the art, the functions of inlet 30 and outlet 32 may be reversed, so that fluid flows into valve 10 via opening 32 and exits the valve via opening 30. Also, any suitable material or materials may be used to form layers 12 and 14. As mentioned above, these layers 12 and 14 may be made from a ceramic, and these layers may also be made from a metal alloy such as stainless steel.

The preferred embodiment of the invention, as described above in detail, provides a number of important advantages. For instance, microvalve 10 is very well suited for use in applications where high temperatures or corrosive conditions exist. SiC is a very robust material against chemical corrosion. At the present time, there is no known chemical that will etch SiC at a rate greater than 100 Angstroms/min. Therefore, a microvalve constructed or manufactured from SiC will resist potentially corrosive chemicals in the environment. Further, microvalve 10 can control a very high pressure gas feed due to the mechanical design as well as the force capabilities of the actuation mechanism. The combination of robustness against chemical corrosion, high temperature compatibility, and high pressure control makes microvalve 10 ideally suited for harsh environments. These may include such applications as aircraft engines, power turbines, or missile systems.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A microvalve comprising:
    first and second layers secured together to form a valve body, the valve body forming an inlet opening for receiving fluid, an outlet opening for conducting the fluid from the valve body, and a flow channel for conducting the fluid from the inlet to the outlet;
    a diaphragm member disposed between said first and second layers and moveable between closed and open positions, wherein in the closed position, the diaphragm blocks the flow of fluid from the inlet to the flow channel; and in the closed position, the diaphragm allows fluid flow from the inlet into said flow channel to allow fluid flow from the inlet to the outlet; and wherein the diaphragm is biased to the closed position and moves from the closed position to the open position when the pressure of fluid in the inlet reaches a preset value; and
    an actuator mechanism connected to the valve body for moving the diaphragm to the closed position against the pressure of fluid in the inlet;
    wherein the second layer defines a contoured, sloped recess above a central portion of the diaphragm to receive the diaphragm when the diaphragm moves from the closed position to the open position; and
    the contoured recess is formed by a series of generally concentric areas, at successively greater depths extending inward from a surface of the second area.

2. A micro-valve according to claim 1, wherein the contoured recess is formed by using a laser to form said series of generally concentric areas.

3. A microvalve according to claim 1, wherein adjacent concentric areas are spaced apart between 1 and 10 um.

4. A microvalve according to claim 1, wherein each of said areas is polygon shaped.

5. A microvalve according to claim 3, wherein each of said areas is a polygon having at least thirty sides.

6. A method according to claim 1, wherein each of said areas is circular shaped.

7. A microvalve according to claim 1, wherein said concentric areas are uniformly spaced apart.

* * * * *